(12) United States Patent
Hakansson et al.

(10) Patent No.: US 7,322,833 B1
(45) Date of Patent: Jan. 29, 2008

(54) CONNECTION OF FPC ANTENNA TO PCB

(75) Inventors: Martin Hakansson, Kalmar (SE); Tommy Stening, Kalmar (SE)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 11/554,729

(22) Filed: Oct. 31, 2006

(51) Int. Cl.
*H01R 12/00* (2006.01)
*H05K 1/00* (2006.01)

(52) U.S. Cl. ......................................... 439/67; 439/916
(58) Field of Classification Search ................... 439/67, 439/916, 493
See application file for complete search history.

(56) References Cited

U.S. PATENT DOCUMENTS 4,116,517 A * 9/1978 Selvin et al. .................. 439/67
6,924,777 B2 * 8/2005 Reasoner et al. ........... 343/866

* cited by examiner

*Primary Examiner*—Javaid H. Nasri
(74) *Attorney, Agent, or Firm*—Robert G. Crouch; Marsh Fischmann & Breyfogle LLP

(57) ABSTRACT

A flexible printed circuit (FPC) onto which an antenna has been formed is electrically connected to a printed circuit board (PCB) by sandwiching the FPC between the PCB and a resilient biasing member that is held in position relative to the PCB by a frame or retaining member. The biasing member may be a soft, flexible material that operates across a broad temperature range.

18 Claims, 2 Drawing Sheets

CONNECTION OF FPC ANTENNA TO PCB

In modern telecommunication devices, it is known to provide an antenna on a flexible printed circuit (FPC). Such antennas provide benefits such as the relatively small size and complex pattern of the antenna. Such FPC antennas are typically mounted to a printed circuit board (PCB) using spring-loaded pogo pins or spring connectors. Of course, the pogo pins or spring connectors need to be soldered to the PCB. With the small profit margins in modern telecommunication devices such as mobile phones, and with constant pressure to lower the cost of such devices, it can be important to reduce the part count in such devices and/or to reduce manufacturing process steps.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

An assembly includes a flexible substrate having two opposite sides, the substrate having conductive traces formed thereon that form an antenna that can receive or transmit RF signals, a portion of at least one conductive trace having a conductive knob formed on one of the sides of the substrate. The assembly also includes a printed circuit board (PCB) having at least one electrical contact pad thereon, the contact pad in contact with the conductive knob of the flexible substrate; and a biasing member in contact with the other of the sides of the substrate to resiliently bias the flexible substrate toward the PCB.

The biasing member may include silicone. The assembly may further include a retaining member held in a stationary position relative to the PCB, the retaining member retaining the biasing member in contact with the flexible substrate. The retaining member may be held in position relative to the PCB with one or more fasteners. The fasteners may include snap features formed on the retaining member that engage with an opening formed in the PCB. The fasteners may include screws. The flexible substrate may be folded back so that a portion of the substrate lies on top of the retaining member. The portion of the substrate that lies on top of the retaining member may includes the antenna.

The flexible substrate may include a stiffener on the portion of the substrate in the is vicinity of the conductive knob. The stiffener may be a thicker layer of the same material as the remainder of the flexible substrate. The flexible substrate may include at least two knobs, one or more of which may be conductive. The flexible substrate may include three knobs. The flexible substrate may also include conductive traces formed thereon that form a second antenna that can receive or transmit RF signals.

In another aspect, an assembly includes a flexible substrate having two opposite sides, the substrate having conductive traces formed thereon that form an antenna that can receive or transmit RF signals, a portion of at least one conductive trace having a conductive knob formed on one of the sides of the substrate; a printed circuit board (PCB) having at least one electrical contact pad thereon, the contact pad in contact with the conductive knob of the flexible substrate; a biasing member in contact with the other of the sides of the substrate to resiliently bias the flexible substrate toward the PCB; and a retaining member held in a stationary position relative to the PCB, the retaining member retaining the biasing member in contact with the flexible substrate.

In another aspect, an assembly includes a flexible printed circuit (FPC) having two opposite sides, the FPC having conductive traces formed thereon, a portion of at least one conductive trace having a conductive knob formed on one of the sides of the FPC; a printed circuit board (PCB) having at least one electrical contact pad thereon, the contact pad in contact with the conductive knob of the FPC; a biasing member in contact with the other of the sides of the FPC to resiliently bias the FPC toward the PCB; and a retaining member held in a stationary position relative to the PCB, the retaining member retaining the biasing member in contact with the FPC.

In another aspect, a method of electrically connecting an antenna to a circuit board includes providing an antenna on a flexible substrate, the antenna having at least one conductive knob formed on a side of the flexible substrate; providing a relatively-less flexible circuit board; providing a resilient biasing member; and sandwiching at least a portion of the flexible substrate between the circuit board and the biasing member so that the conductive knobs contact the circuit board.

The method may further include attaching a retaining member to the circuit board in a manner to hold the biasing member in position relative to the circuit board. The method may further include folding the flexible substrate back to be retained on top of the retaining member. The method may further include providing a stiffener on the flexible substrate to the vicinity of the substrate where the at least one conductive knob is located.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein be considered illustrative rather than limiting.

DETAILED DESCRIPTION

Reference will now be made to the accompanying drawings, which assist in illustrating the various pertinent features of the present invention. Although the present invention will now be described primarily in conjunction with the connection of an FPC antenna to a PCB, it should be expressly understood that the present invention may be applicable to other applications where it is desired to attach any type of FPC to a PCB. In this regard, the following description of an FPC antenna to a PCB is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Figure 1:
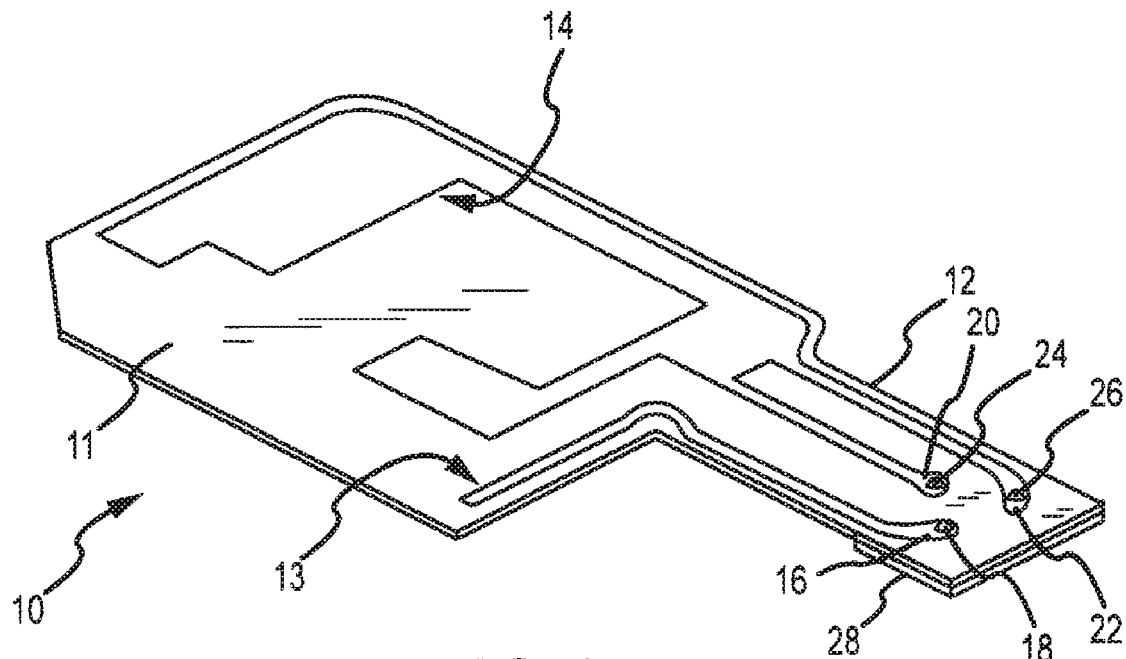
FIG. 1 is a perspective view of an FPC antenna.
Figure 2:
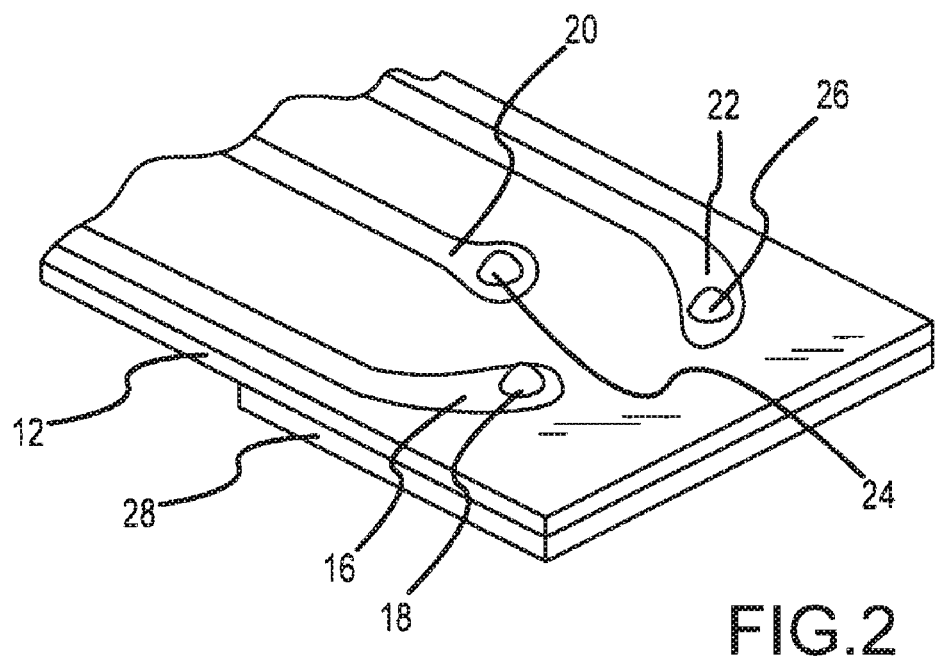
FIG. 2 is an enlarged perspective view of a portion of the FPC antenna of FIG. 1, showing raised knobs on the end of conductive traces on the FPC and a stiffener on the bottom side thereof.

FIG. 1 shows a flexible printed circuit (FPC) 10 that has conductive traces thereon. The FPC 10 includes a central portion 11 and an arm 12 (also shown in FIG. 2) that extends therefrom. The conductive traces form a first antenna 13 and a second antenna 14. The first antenna 13 includes a terminal portion 16 at one end thereof (that is located on the arm 12 of the FPC 10) where a raised conductive knob 18 is created on the conductive trace. The second antenna 14 includes two terminal portions 20 and 22 (located on the arm 12 of the FPC 10) where raised knobs 24 and 26 are created on the conductive trace.

The FPC 10 may be composed of PET, a plastic known in the electronics industry. Purely by way of example, the FPC 10 may have a thickness in the range of 0.05 mm. In the region of the arm 12 of the FPC 10 where the terminal portions 16, 20, and 22 are located, the FPC 10 may include a stiffener 28 to increase the rigidity of the FPC 10 in this region. This stiffener 28 may be created by applying a thicker layer of the PET material. Purely by way of example, the thickness of the stiffener 28 may be 0.2 mm. By comparison, the copper metal of the conductive traces may have a thickness on top of the FPC of 20 µm. The raised knobs 18, 24, and 26 can be of any appropriate height so as to effectuate a solid contact with the contacts against which they are placed. In this example, the height of the raised knobs 18, 24, and 26 is in the range of tenths of millimeters.

Figure 3:
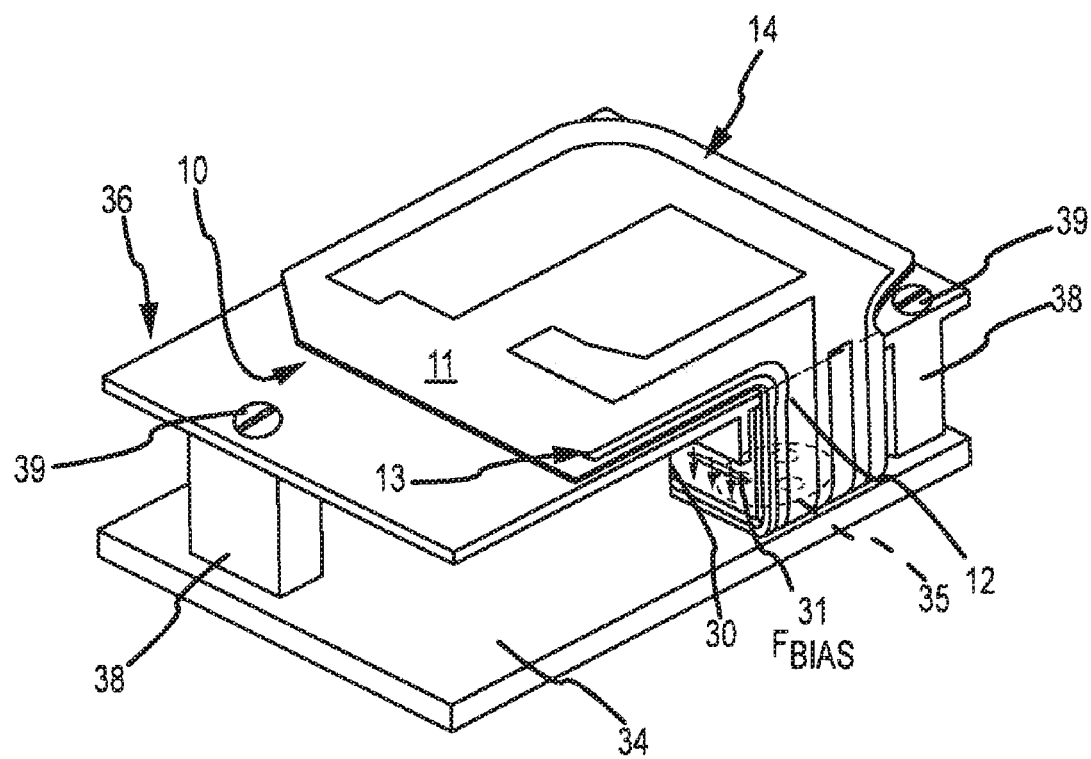
FIG. 3 is a perspective view of the FPC antenna of FIG. 1 attached to a PCB by a resilient biasing member that is held in place by a retaining member.
Figure 4:
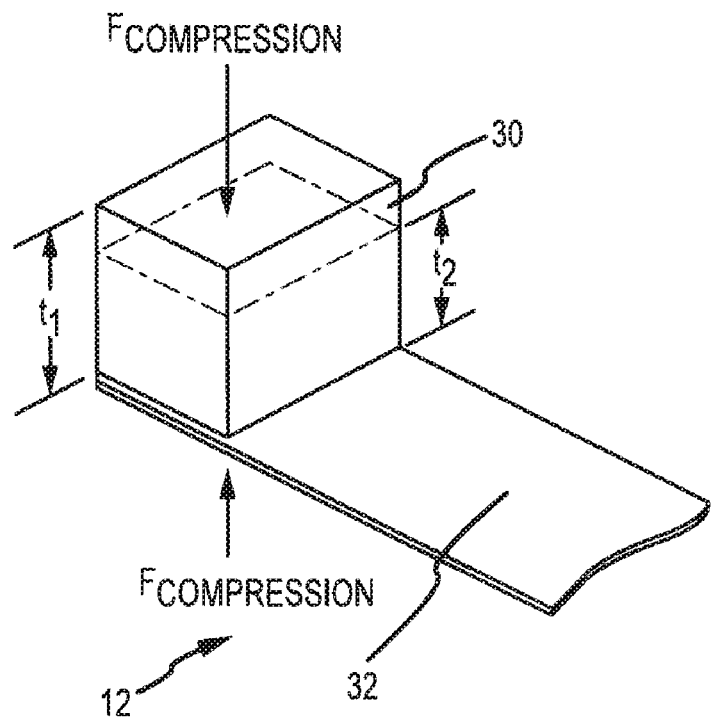
FIG. 4 is a perspective view of the FPC antenna and the resilient biasing member.

As shown in FIGS. 3 and 4, a soft, resilient, biasing member 30 can be placed against a back side 32 of the arm 12 of the FPC 10 in order to urge or bias the raised knobs 18, 24, and 26 of the first and second antennas 13 and 14 toward an adjacent circuit board. For example the arm 12 of the FPC may be biased against a contact pad 35 on the printed circuit board (PCB) 34 by a biasing force, $F_{bias}$, (shown with arrows 31) generated by the biasing member 30 when it is compressed by retaining member 36 to the PCB 34. Application of such compressive forces cause the resilient biasing member 30 to have its thickness changed from an at rest or original thickness, $t_1$, to a compressed or second thickness, $t_2$, and the resilient characteristics of the member 30 cause it to try to return to the at rest or original thickness, $t_1$. By way of example, the biasing member 30 may be composed of a silicone cellular material that is designed to be flexible and resilient and to maintain such characteristics over a broad temperature range (e.g., from −40° C. to +60° C.).

As shown in FIG. 3, the FPC 10 can be attached to a printed circuit board (PCB) 34 with a frame or retaining member 36 that is attached to the PCB 34. The retaining member 36 holds the biasing member 30 in position relative to the PCB 34 so that the portion of the arm 12 of the FPC 10 that includes the raised knobs 18, 24, and 26 is sandwiched between the biasing member 30 and the PCB 34. The remainder of the arm 12, after being folded, lies against the side of the biasing member 30, and the central portion 11 of the FPC 10 lies on top of the retaining member 36. The retaining member 36 may be attached to the PCB 34 by any known means of fastening one part to the other, such as screws 39 or the like, or snap features in one of the retaining member 30 or the PCB 34 that mate with slots in the other. The FPC 10 may have an adhesive attached to its back side for ease of attachment of the FPC to the biasing member 30 and the retaining member 36. Alternatively, the biasing member 30 may have adhesive on it for attachment to the FPC 10 and/or the retaining member 36. Further, any combination of such means for attaching members to each other could also be used.

The PCB 34 may be composed of any suitable circuit board material. By way of example, the PCB 34 could be composed of SR4 material and as an example may be of a thickness between 0.8 and 1.6 mm. As can be appreciated, the PCB 34 can have electrical contact pads formed thereon that correspond to the corresponding locations of the raised knobs 18, 24, and 26 on the FPC 10. The retaining member 36 may be composed of any suitable material. As one example, the material may be a plastic such as PC-ABS. With the PCB 34 and retaining member 36 each being relatively less flexible than the FPC 10 and the biasing member 30, the portion of the FPC containing the knobs 18, 24, and 26 will be retained between the biasing member 30 and the PCB 34 in a manner to maintain electrical connection between the knobs 18, 24, and 26 and the corresponding contact pads on the PCB 34.

Although all dimensions herein and particularly the following sizes are merely exemplary, in one example the biasing member 30 may have dimensions of 4 mm×5 mm×2 mm and the assembly shown in FIG. 3 may have an overall size of 40 mm×30 mm×8 mm.

The first and second antennas 13 and 14 may be any type of antenna that can be formed on an FPC. In one example, however, the first antenna 13 may be a Bluetooth antenna while the second antenna 14 may be a GSM antenna. Any other type or combination of antennas is also possible. Furthermore, the teachings herein are equally applicable to an FPC with a single antenna or an FPC with more than two antennas. Similarly, more than one FPC could be attached to the same PCB.

Different antennas may have different numbers of electrical contacts required thereby. Further, there may be a different number of raised knobs for contact with the PCB. Of course, it would be possible to provide multiple raised knobs on a single conductive trace if it were desired to have at least a certain number of raised knobs. In this example, three knobs are used and that number provides a relatively stable platform.

The retaining member 36 may have any number of legs 38 for attachment to the PCB. In one example, the retaining member 36 has three such legs 38. Furthermore, the retaining member 36 may include features thereon to define a partial pocket to partially retain the biasing member 30, as shown in FIG. 3.

The knobs 18, 24, and 26 may be formed in the etching/ stamping process of placing the conductive traces onto the FPC 10. In one example, a stamping process deforms the plastic of the FPC and the copper of the conductive trace to create such a knob. In another example, the knob may be formed by the deposition of an additional thickness of copper or other conductive metal at the location of the knob in order to form same. In addition to gold plating of the conductive traces and the knobs, nickel plating is used as well. This may be done to increase the hardness in the region of the knob, since this is the area that will be in contact with and pressed against the PCB 34.

Any of many other types of retaining members or suitable alternatives could be used to hold the relevant portion of the FPC against the PCB. For example, some designs may not include a separate retaining member, but may instead use a portion of the overall housing of the telecommunication device, such as the housing of a mobile phone, to hold the biasing member 30 against the PCB 34 in a fashion to retain the relevant portion of the FPC 10 therebetween.

The stiffener 28 may help by reducing bending of the FPC 10 in the region where the knobs 18, 24, and 26 are, in order to keep the knobs in contact with the PCB 34. Another alternative to the example shown herein may include stiffeners composed of other materials, which may be different than the material of the FPC 10. In addition, it may also be possible to achieve the same objectives without such a stiffener.

As can be appreciated, the assembly described herein does not require attachment hardware that needs to be soldered to the PCB, such as pogo pins or spring connectors.

The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. It is therefore intended that the following appended claims and claims hereafter introduced are interpreted to include all such variations, modifications, permutations, additions, and sub-combinations as are within their true spirit and scope.

What is claimed is:

1. An assembly, comprising:
   a flexible substrate having two opposite sides, the substrate having conductive traces formed thereon that form an antenna that can receive or transmit RF signals, a portion of at least one conductive trace having a conductive knob formed on one of the sides of the substrate;
   a printed circuit board (PCB) having at least one electrical contact pad thereon, the contact pad in contact with the conductive knob of the flexible substrate;
   a biasing member in contact with the other of the sides of the substrate to resiliently bias the flexible substrate toward the PCB; and
   a retaining member positioned adjacent to the PCB retaining the biasing member in contact with the flexible substrate, wherein the flexible substrate is folded back so that a first portion of the flexible substrate lies on top of the retaining member and a second portion of the flexible substrate comprising the conductive knob abuts the PCB and wherein the biasing member is positioned between the retaining member and the second portion of the flexible substrate.

2. An assembly as defined in claim 1, wherein the biasing member includes silicone.

3. An assembly as defined in claim 1, wherein the retaining member is held in position relative to the PCB with one or more fasteners.

4. An assembly as defined in claim 3, wherein the fasteners include screws.

5. An assembly as defined in claim 1, wherein the first portion of the substrate that lies on top of the retaining member includes the antenna.

6. An assembly as defined in claim 1, wherein the flexible substrate includes a stiffener on the portion of the substrate in the vicinity of the conductive knob.

7. An assembly as defined in claim 6, wherein the stiffener is a thicker layer of the same material as the remainder of the flexible substrate.

8. An assembly as defined in claim 1, wherein the flexible substrate includes at least two knobs, one or more of which may be conductive.

9. An assembly as defined in claim 8, wherein the flexible substrate includes three knobs.

10. An assembly as defined in claim 1, wherein the flexible substrate also includes conductive traces formed thereon that form a second antenna that can receive or transmit RF signals.

11. An assembly, comprising:
    a flexible substrate having two opposite sides, the substrate having conductive traces formed thereon that form an antenna that can receive or transmit RF signals, a portion of at least one conductive trace having a conductive knob formed on one of the sides of the substrate;
    a printed circuit board (PCB) having at least one electrical contact pad thereon, the contact pad in contact with the conductive knob of the flexible substrate;
    a biasing member in contact with the other of the sides of the substrate to bias the flexible substrate toward the PCB; and
    a retaining member held in a stationary position relative to the PCB, the retaining member retaining the biasing member in contact with the flexible substrate, wherein the flexible substrate is wrapped about at least a portion of the biasing member such that a first portion of the flexible substrate comprising the antenna is spaced apart from the PCB by at least about a thickness of the biasing member and such that a second potion of the flexible substrate comprising the conductive knob is positioned in contact with the PCB.

12. An assembly as defined in claim 11, wherein the flexible substrate includes a stiffener on the portion of the substrate in the vicinity of the conductive knob.

13. The assembly of claim 11, wherein the first and second portions of the flexible substrate are substantially planar and wherein the first portion is substantially parallel to the second portion of the flexible substrate.

14. The assembly of claim 11, wherein the first portion of the flexible substrate is attached to a surface of the retaining member opposite a surface of the retaining member contacting the biasing member.

15. An assembly, comprising:
    a flexible printed circuit (FPC) having two opposite sides, the FPC having conductive traces formed thereon, a portion of at least one conductive trace having a conductive knob formed on one of the sides of the FPC in an arm portion of the FPC and an antenna formed with the conductive traces formed on the one side of the FPC in a central portion from which the arm portion extends;
    a printed circuit board (PCB) having at least one electrical contact pad thereon, the contact pad in contact with the conductive knob of the FPC;
    a biasing member in contact with the other of the sides of the FPC to resiliently bias the FPC toward the PCB; and
    a retaining member held in a stationary position relative to the PCB, the retaining member retaining the biasing member in contact with the FPC, wherein the arm portion of the FPC is sandwiched between the biasing member and the PCB proximate to the electrical contact pad.

16. The assembly of claim 15, wherein the FPC is configured to wrap around at least a portion of the biasing member such that the arm portion of the FPC extends adjacent at least two sides of the biasing member.

17. The assembly of claim 15, wherein the FPC is folded in the assembly such the central portion and at least part of the arm portion are spaced apart and substantially parallel.

18. The assembly of claim 15, wherein the central portion of the FPC is attached to a surface of the retaining member opposite a surface contacting the biasing member.

* * * * *